(12) United States Patent
Gong et al.

(10) Patent No.: US 11,877,384 B2
(45) Date of Patent: Jan. 16, 2024

(54) FLEXIBLE CIRCUIT BOARD, MANUFACTURING METHOD THEREOF AND DISPLAY PANEL

(71) Applicants: Chengdu BOE Optoelectronics Technology Co., Ltd., Sichuan (CN); BOE TECHNOLOGY GROUP CO., LTD., Beijing (CN)

(72) Inventors: Qing Gong, Beijing (CN); Xu Lu, Beijing (CN); Zijian Wang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 77 days.

(21) Appl. No.: 17/511,681

(22) Filed: Oct. 27, 2021

(65) Prior Publication Data

US 2022/0272832 A1 Aug. 25, 2022

(30) Foreign Application Priority Data

Feb. 20, 2021 (CN) .......................... 202110194418.0

(51) Int. Cl.
*H05K 1/02* (2006.01)
*H05K 9/00* (2006.01)

(52) U.S. Cl.
CPC ........... *H05K 1/0216* (2013.01); *H05K 1/028* (2013.01); *H05K 9/0083* (2013.01); *H05K 2201/0723* (2013.01); *H05K 2201/10128* (2013.01)

(58) Field of Classification Search
CPC .. H05K 1/0216; H05K 1/0218; H05K 1/0277; H05K 1/0278; H05K 1/028;
(Continued)

(56) References Cited

U.S. PATENT DOCUMENTS

2015/0185527 A1* 7/2015 Chang ................. H10K 50/8426
349/12
2017/0162821 A1* 6/2017 Oh ......................... H10K 59/12
(Continued)

FOREIGN PATENT DOCUMENTS

CN 208387000 U 1/2019
CN 209897344 U 1/2020
(Continued)

OTHER PUBLICATIONS

China Patent Office, First Office Action dated Nov. 23, 2021, for corresponding Chinese application No. 202110194418.0.

*Primary Examiner* — Hoa C Nguyen
*Assistant Examiner* — John B Freal
(74) *Attorney, Agent, or Firm* — HOUTTEMAN LAW LLC (57) ABSTRACT

The present disclosure provides a flexible circuit board and a display panel. The flexible circuit board is in a non-display region of a display panel and provided with a driving circuit for driving the display panel thereon. The flexible circuit board includes a first main body portion, a second main body portion, and a foldable portion, and the foldable portion is between the first main body portion and the second main body portion. The foldable portion is capable of being bent to fold the second main body portion such that the second main body portion overlaps the first main body portion.

18 Claims, 5 Drawing Sheets

(58) Field of Classification Search
CPC ............. H05K 1/0281; H05K 2201/05; H05K 2201/055; H05K 2201/07; H05K 2201/0707; H05K 2201/0715; H05K 2201/0723

See application file for complete search history.

(56) References Cited

U.S. PATENT DOCUMENTS

2019/0036068 A1* 1/2019 Kim .................... G06F 1/1601
2019/0081420 A1 3/2019 Chuo et al.

FOREIGN PATENT DOCUMENTS

| CN | 111511098 A | 8/2020 |
| EP | 0443717 A2 | 8/1991 |

* cited by examiner

FLEXIBLE CIRCUIT BOARD, MANUFACTURING METHOD THEREOF AND DISPLAY PANEL

CROSS-REFERENCE TO RELATED APPLICATIONS

The present disclosure claims the priority of Chinese Patent Application No. 202110194418.0, filed on Feb. 20, 2021, the contents of which are incorporated herein by reference in its entirety.

TECHNICAL FIELD

The present disclosure relates to the field of display technology, and in particular to a flexible circuit board, a manufacturing method thereof and a display panel.

BACKGROUND

A Flexible Printed Circuit (FPC) board is a printed circuit board having high reliability and excellent flexibility, and is often applied to a display panel due to its advantages such as a high wiring density, lightness and thinness. Along with the development of the display panel, the display panel has more functions and is larger in size, therefore more wiring lines are required, and correspondingly a larger area of the wiring region is required, as a result only an increased size of the FPC board can meet the wiring requirement. However, the space occupied by the FPC board is too large, so that the space for arranging other components is decreased. Alternatively, wiring is performed by stacking a plurality of FPC board layers, but the thickness of the display panel increases due to the plurality of FPC board layers, which is not advantageous for making the display panel thinner.

SUMMARY

As an aspect, a flexible circuit board is provided. The flexible circuit board is in a non-display region of a display panel and provided with a driving circuit for driving the display panel thereon. The flexible circuit board includes a first main body portion, a second main body portion, and a foldable portion, and the foldable portion is between the first main body portion and the second main body portion. The foldable portion is capable of being bended to fold the second main body portion such that the second main body portion overlaps the first main body portion.

In an embodiment, the flexible circuit board has a first surface and a second surface opposing to each other. The first main body portion has an overlapping region and a non-overlapping region, a region where the second main body portion overlaps the first main body portion after the foldable portion is bent being the overlapping region, and a region where the second main body portion does not overlap the first main body portion after the foldable portion is bent being the non-overlapping region. The flexible circuit board further includes a first adhesive, a second adhesive, and a third adhesive. The first adhesive is on the second surface, corresponds to the first main body portion, and in the non-overlapping region. The second adhesive is on the second surface, corresponds to the first main body portion, and is in the overlapping region. The third adhesive is on the first surface, corresponds to the second main body portion, and covers the second main body portion. None of the first adhesive, the second adhesive and the third adhesive is on two sides of the foldable portion.

In an embodiment, an orthographic projection of the first adhesive on the first main body portion is completely within the non-overlapping region of the first main body portion, and an orthographic projection of the second adhesive on the first main body portion is completely within the overlapping region of the first main body portion.

In an embodiment, when the second main body portion overlaps the first main body portion after the foldable portion is folded, the second main body portion is attached to the first main body portion via the second adhesive in the overlapping region, and a surface of the first adhesive distal to the first surface is on the same plane as a surface of the third adhesive proximal to the first surface.

In an embodiment, when the foldable portion is bent, both of an orthographic projection of the first adhesive on the first main body portion and an orthographic projection of the third adhesive on the first main body portion completely cover the second surface of the first main body portion, and the orthographic projection of the first adhesive on the first main body portion is complementary to the orthographic projection of the third adhesive on the first main body portion.

In an embodiment, the driving circuit is capable of being attached to a non-light-emitting side of the display panel through the first and second adhesives.

In an embodiment, each of a thickness of the second adhesive and a thickness of the third adhesive is less than a thickness of the first adhesive.

In an embodiment, each of the first adhesive, the second adhesive and the third adhesive is a double-sided adhesive tap.

In an embodiment, the first main body portion includes a first covering film layer, a first bonding adhesive layer, a first copper foil layer, a base layer, a second copper foil layer, a second bonding adhesive layer and a second covering film layer sequentially arranged, and each of the second main body portion and the foldable portion comprises the same structure as the first main body.

In an embodiment, the flexible circuit board further includes a first electro-magnetic interference protection layer and a second electro-magnetic interference protection layer both configured to shield electromagnetic interference. The first electro-magnetic interference protection layer includes a first portion and a second portion separated apart from each other. The first portion is on the first surface and corresponds to the first main body portion, the second portion is on the first surface and corresponds to the second main body portion, and the third adhesive is on a side of the second portion of the first electro-magnetic interference protection layer away from the second surface. The second electro-magnetic interference protection layer is on the second surface and corresponds to the first main body portion, and the first adhesive is on a side of the second electro-magnetic interference protection layer away from the first surface. None of the first electro-magnetic interference protection layer and the second electro-magnetic interference protection layer is on the first surface and the second surface of the foldable portion, and no electro-magnetic interference protection layer is on the second surface of the second main body portion.

In an embodiment, each of the first electro-magnetic interference protection layer and the second electro-magnetic interference protection layer includes a conductive adhesive layer containing copper particles or silver particles.

In an embodiment, an orthographic projection of the first portion of the first electro-magnetic interference protection layer on the first main body portion overlaps both of orthographic projections of the first adhesive and the second adhesive on the first main body portion, and an orthographic projection of the second portion of the first electro-magnetic interference protection layer on the second main body portion overlaps an orthographic projection of the third adhesive on the second main body portion. An orthographic projection of the second electro-magnetic interference protection layer on the first main body portion overlaps the orthographic projections of the first adhesive and the second adhesive on the first main body portion.

In an embodiment, the flexible circuit board further includes a first bonding region on a side of the first main body portion away from the second main body portion. A coupling pad in the first bonding region is configured to be bonded with a coupling pad of the display panel.

In an embodiment, the foldable portion has at least one hollowed-out portion for relieving stress.

In an embodiment, the foldable portion has a plurality of hollowed-out portions uniformly distributed and spaced apart from each other along a length direction of the foldable portion.

In an embodiment, a thickness of the foldable portion is less than each of a thickness of the first main body portion and a thickness of the second main body portion.

As another aspect, a flexible display panel is provided. The flexible display panel has a display region, a foldable region and a second bonding region. The foldable region is between the display region and the second bonding region. The flexible display panel includes the flexible circuit board having a first bonding region described above. A coupling pad in the first bonding region is capable of being bonded to a coupling pad in the second bonding region. After the flexible display panel is bent at the foldable region, the driving circuit of the flexible circuit board is fold to the non-light-emitting side of the flexible display panel.

As yet another aspect, a flexible circuit board is provided. The flexible circuit board is in a non-display region of a display panel with a driving circuit for driving the display panel provided thereon. The flexible circuit board includes first main body portion, a second main body portion, and a foldable portion. The foldable portion is between the first main body portion and the second main body portion. The foldable portion is capable of being bent to fold the second main body portion such that the second main body portion overlaps the first main body portion. The flexible circuit board includes a first surface and a second surface opposing to each other. The first main body portion has an overlapping region and a non-overlapping region, a region where the second main body portion overlaps the first main body portion after the foldable portion is bent being the overlapping region, and a region where the second main body portion does not overlap the first main body portion after the foldable portion is bent being the non-overlapping region. The flexible circuit board further includes a first adhesive, a second adhesive, and a third adhesive. The first adhesive is on the second surface, corresponds to the first main body portion, and in the non-overlapping region. The second adhesive is on the second surface, corresponds to the first main body portion, and is in the overlapping region. The third adhesive is on the first surface, corresponds to the second main body portion, and covers the second main body portion. None of the first adhesive, the second adhesive and the third adhesive is on two sides of the foldable portion. When the second main body portion overlaps the first main body portion after the foldable portion is bent, the second main body portion is attached to the first main body portion through the second adhesive in the overlapping region, and a surface of the first adhesive distal to the first surface is on the same plane as a surface of the third adhesive distal to the first surface. When the foldable portion is fold, an orthographic projection of the first adhesive on the first main body portion and an orthographic projection of the third adhesive on the first main body portion completely cover the second surface of the first main body portion, and the orthographic projection of the first adhesive on the first main body portion is complementary to the orthographic projection of the third adhesive on the first main body portion. The flexible circuit board further includes a first electro-magnetic interference protection layer and a second electro-magnetic interference protection layer both configured to shield electromagnetic interference. The first electro-magnetic interference protection layer includes a first portion and a second portion separated apart from each other. The first portion is on the first surface and corresponds to the first main body portion. The second portion is on the first surface and corresponds to the second main body portion, and the third adhesive is on a side of the second portion of the first electro-magnetic interference protection layer away from the second surface. The second electro-magnetic interference protection layer is on the second surface and corresponds to the first main body portion, and the first adhesive is on a side of the second electro-magnetic interference protection layer away from the first surface. None of the first electro-magnetic interference protection layer and the second electro-magnetic interference protection layer is on the first surface and the second surface of the foldable portion, and no electro-magnetic interference protection layer is on the second surface of the second main body portion.

As an aspect, a method for manufacturing a flexible circuit board is provided. The flexible circuit board is in a non-display region of a display panel and provided with a driving circuit for driving the display panel thereon. The method includes: providing a body portion including a first main body portion, a second main body portion, and a foldable portion, the foldable portion being between the first main body portion and the second main body portion; and bending the foldable portion to fold the second main body portion such that the second main body portion overlaps the first main body portion.

DETAILED DESCRIPTION

In order to make the objects, technical solutions and advantages of the embodiments of the present disclosure more apparent, the technical solutions of the embodiments of the present disclosure will be described clearly and completely below with reference to the drawings of the embodiments of the present disclosure. It is to be understood that the described embodiments are only some embodiments of the present disclosure, and not all embodiments. All other embodiments, which can be derived by a person skilled in the art from the described embodiments of the present disclosure without inventive step, are within the scope of protection of the present disclosure.

Figure 1:
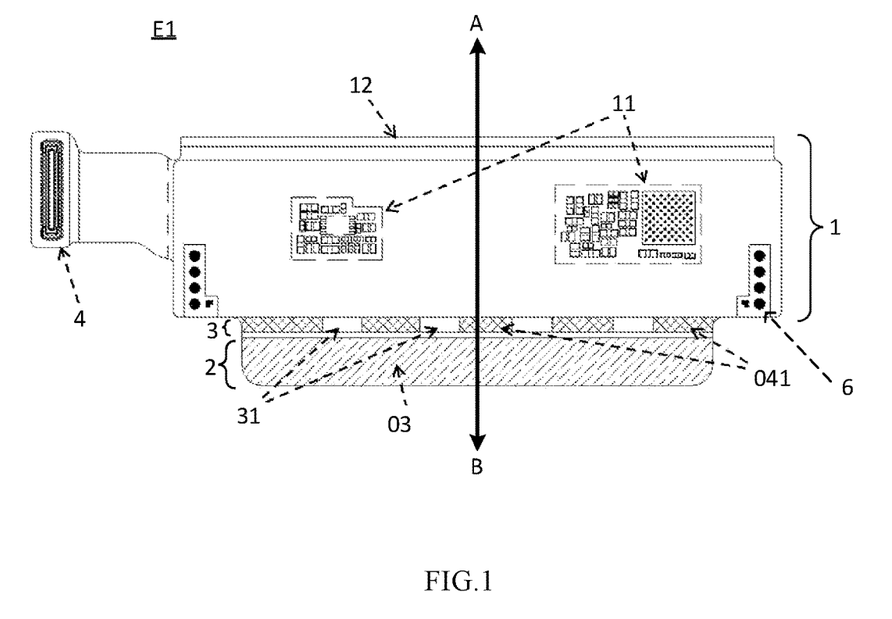
FIG. 1 is a schematic diagram showing a structure (i.e., a first surface in an unfolded state) of a flexible circuit board according to an embodiment of the present disclosure.
Figure 2:
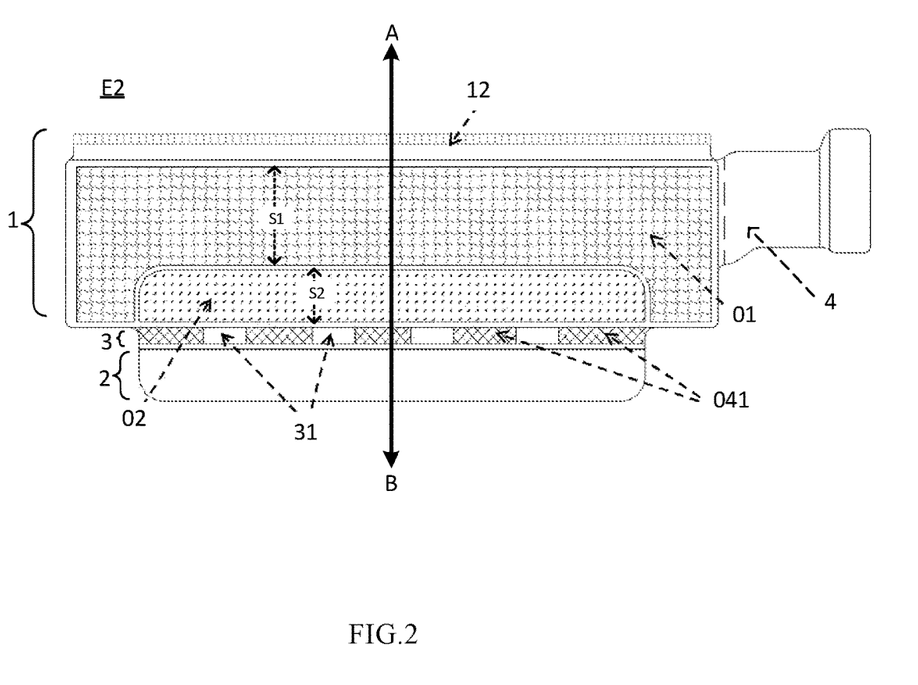
FIG. 2 is a schematic diagram showing a structure (i.e., a second surface in an unfolded state) of a flexible circuit board according to an embodiment of the present disclosure.
Figure 3:
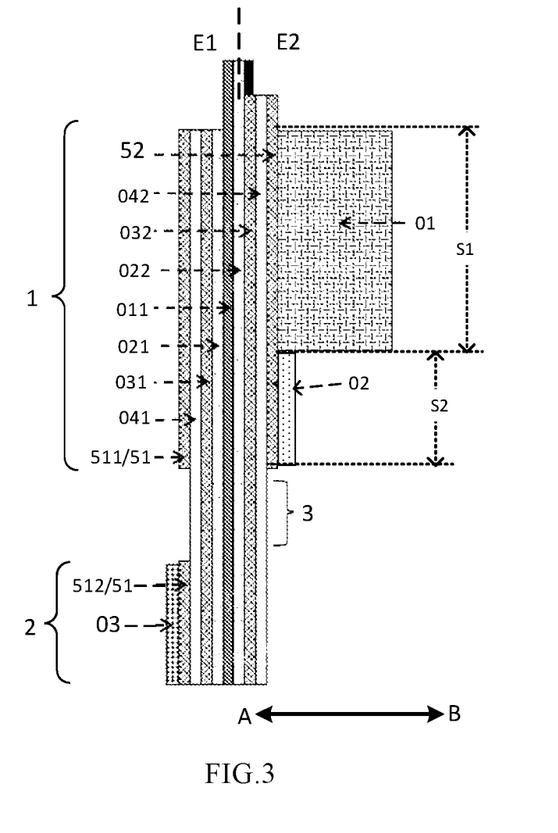
FIG. 3 is a cross-sectional view of a flexible circuit board taken along a line A-B in FIG. 1 or FIG. 2.
Figure 4:
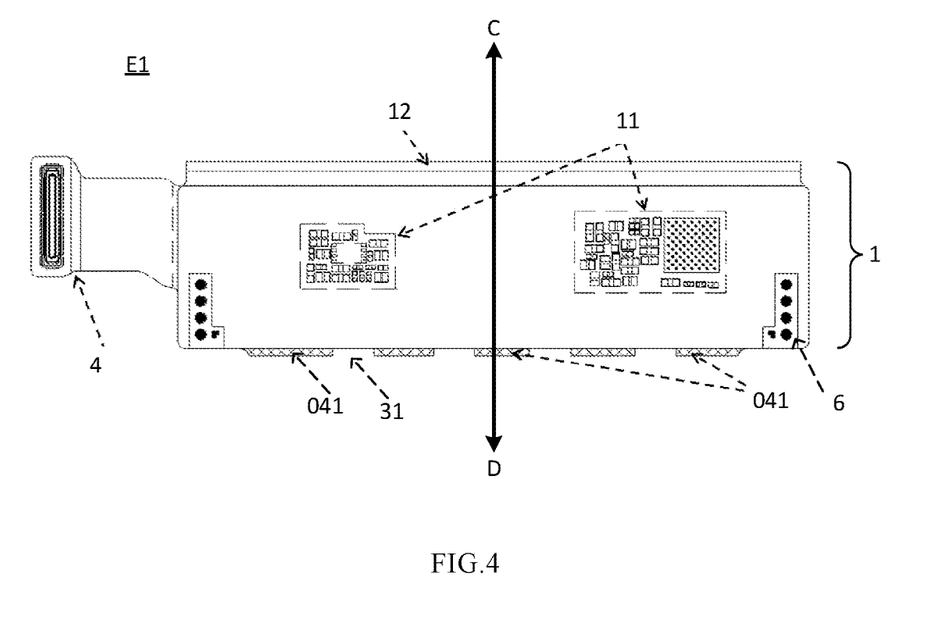
FIG. 4 is a schematic diagram showing a structure (i.e., a first side in a folded state) of a flexible circuit board according to an embodiment of the present disclosure.
Figure 5:
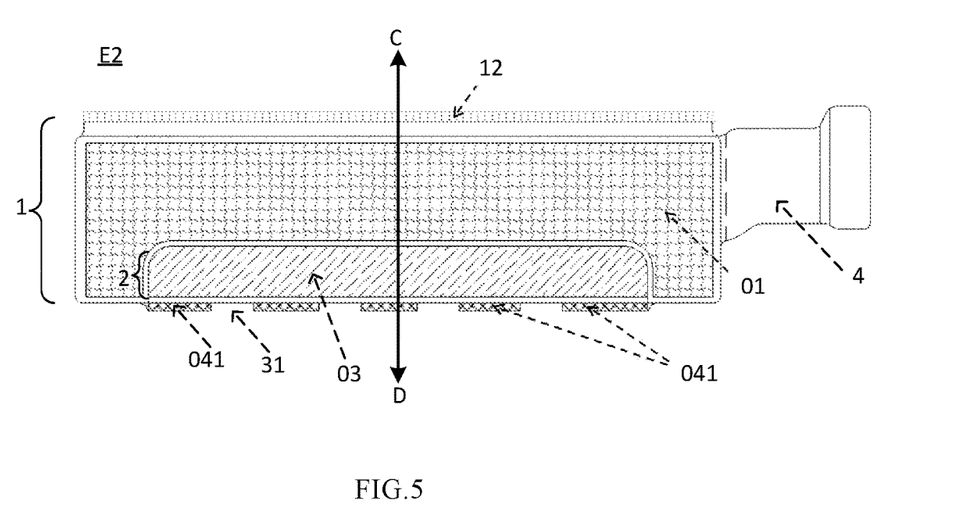
FIG. 5 is a schematic diagram showing a structure (i.e., a second side in a folded state) of a flexible circuit board according to an embodiment of the present disclosure.
Figure 6:
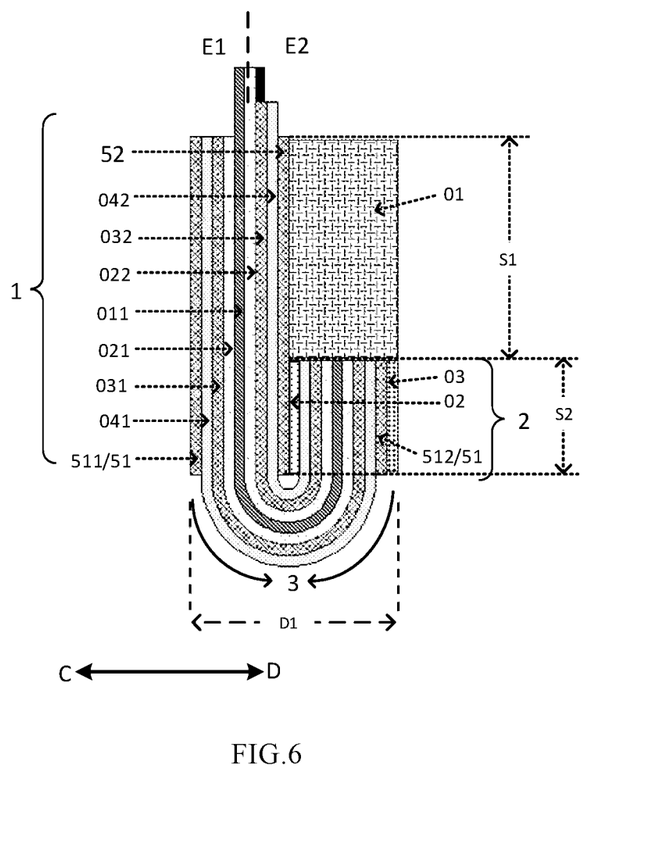
FIG. 6 is a cross-sectional view of a flexible circuit board taken along a line C-D in FIG. 4 or FIG. 5.

As a first aspect, an embodiment of the present disclosure provides a Flexible Printed Circuit (FPC) board. Referring to FIG. 1 to FIG. 6, FIG. 1 to FIG. 3 are schematic diagrams showing a structure of the FPC board in an unfolded state, and FIG. 4 to FIG. 6 are schematic diagrams showing a structure of the FPC board in a folded state. The FPC board includes a first main body portion 1, at least one second main body portion 2, and at least one foldable portion 3. As shown in FIG. 1 to FIG. 6, for example, one second main body portion 2 is located on a side of the first main body portion 1, and one folded portion 3 is between one first main body portion 1 and the one second main body portion 2. Referring to FIG. 1 to FIG. 3, when the FPC board is in an unfolded state, the first main body portion 1, the second main body portion 2, and the foldable portion 3 may be located on a same plane. Referring to FIG. 4 to FIG. 6, the FPC board has a first surface E1 and a second surface E2 opposite to each other. When the FPC board is in a folded state, the foldable portion 3 is bent to fold the second main body portion 2 from the first surface E1 of the first main body portion 1 to the second surface E2 of the first main body portion 1, so that the second main body portion 2 overlaps the first main body portion 1. That is, an orthographic projection of the first main body portion 1 along a direction perpendicular to a plane where the first main body portion 1 is located overlaps an orthographic projection of the second main body portion 2 along a direction perpendicular to a plane where the second main body portion 2 is located. Since the FPC board including the first main body portion 1 and the second main body portion 2 are folded at the foldable portion 3, the area occupied by the FPC board can be reduced through being folded under the condition that the FPC board has a larger area of wiring region. When the FPC board is applied to a display panel, the FPC board is disposed in a peripheral region of the display panel, and the remaining space of the peripheral region of the display panel is large after the FPC board is folded, so that the space left for other components (such as a battery) is correspondingly increased.

It should be noted that, the FPC board may have only one foldable portion 3 and one second main body portion 2 correspondingly, and then the foldable portion 3 may be folded. Of course, the FPC board may also have a plurality of foldable portions 3, each of the foldable portions 3 is connected between the first main body portion 1 and one second main body portion 2, and the plurality of foldable portions 3 may be folded and arranged according to the area to be reduced of the FPC board, which is not limited herein. In the following embodiments, the FPC board is described by way of an example in which only one foldable portion 3 and only one second main body portion 2 are provided in the FPC board, but the present invention is not limited thereto.

In some embodiments, the FPC board has a first surface E1 and a second surface E2 opposite to each other. The first surface E1 may accommodate an electronic device 11 such as a driver chip thereon, and a bonding region 12 may be further disposed on a side (e.g., an upper side in FIG. 1) on the first surface E1. A plurality of coupling pads are disposed in the bonding region 12. The coupling pads in the bonding region 12 of the FPC board can be bonded to coupling pads of an external device (e.g., a display panel) to connect the FPC board to the external device for transmission of electrical signals. The second surface E2 of the FPC board may be covered by an adhesive to fix the FPC board in a predetermined position through the adhesive. Specifically, the first main body portion 1 may have an overlapping region S2 and a non-overlapping region S1. In a case the FPC board is bent, a region in which an orthogonal projection of the second main body portion 2 along a direction perpendicular to a plane where the second main body portion 2 is located overlaps with an orthogonal projection of the first main body portion 1 along a direction perpendicular to a plane where the first main body portion 1 is located is the overlapping region S2, and a region other than the overlapping region S2 of the first main body portion 1 is the non-overlapping region S1. In an embodiment, in a case the FPC board is bent, an region where an orthogonal projection of the second main body portion 2 along a direction perpendicular to a plane where the second main body portion 2 is located does not overlap an orthogonal projection of the first main body portion 1 along a direction perpendicular to a plane where the first main body portion 1 is located is the non-overlapping region S1. The FPC board may further include a first adhesive 01, a second adhesive 02, and a third adhesive 03. Referring to FIG. 2, the first adhesive 01 is disposed on a region on the second surface E2 of the FPC corresponding to the first main body portion 1, and the first adhesive 01 only covers the non-overlapping region S1 of the first main body portion 1. That is, an orthographic projection of the first adhesive 01 on the first main body portion 1 is within the non-overlapping region S1 of the first main body portion 1. With continued reference to FIG. 2, the second adhesive 02 is disposed in a region on the second surface E2 of the FPC corresponding to the first main body portion 1, and the second adhesive 02 only covers the overlapping region S2 of the first main body portion 1. That is, an orthographic projection of the second adhesive 02 on the first main body portion 1 is within the overlapping region S2 of the first main body portion 1. Referring to FIG. 1, the third adhesive 03 is disposed in a region on the first surface E1 of the FPC corresponding to the second main body portion 2, and the third adhesive 03 covers only the second main body portion 2. That is, an orthographic projection of the third adhesive 03 along a direction perpendicular to a plane where the second main body portion 2 is located is within an orthographic projection of the second main body portion 2 along a direction perpendicular to a plane where the second main body portion 2 is located. No adhesive is disposed on either the first surface E1 or the second surface E2 of the folded portion 3. Referring to FIG. 1 to FIG. 3, when the FPC board is in the unfolded state, the first adhesive 01 and the third adhesive 03 are located on opposite surfaces, and the first adhesive 01 and the second adhesive 02 are located on the same surface. Referring to FIG. 4 to FIG. 6, when the FPC board is in a folded state, the foldable portion 3 is fold, the second main body portion 2 is turned over onto the second surface E2 of the first main body portion 1. The second surface E2 of the second main body portion 2 is adhered to the second adhesive 02, and is fixed to the second surface E2 of the first main body portion 1 in the overlapping region S2 via the second adhesive 02 (as shown in FIG. 6). The third adhesive 03 covering the first surface E1 of the second main body portion 2 is also located in the overlapping region S2, the third adhesive 03 and the first adhesive 01 complement with each other to form a full-faced adhesive which is located on the second surface E2 of the FPC board and covers the second surface E2 of the first main body portion 1. When the FPC board is applied to the display panel, the FPC board can be fixed to a predetermined position via the full-faced adhesive formed by the third adhesive 03 and the first adhesive 01, for example, the FPC board can be fixed to a back plate which is on a side of the display panel away from the light-emitting side. In an embodiment, the driving circuit can be attached to a non-light-emitting side of the display panel via the first and second adhesives.

In some embodiments, referring to FIG. 6, when the FPC board is in a folded state, that is, when the second surface E2 of the second main body portion 2 is adhered to the second adhesive 02, the first adhesive 01 and the third adhesive 03 may spliced together to form a whole piece of adhesive as the adhesive on the second surface E2 of the FPC board. A surface of the first adhesive 01 away from the second surface E2 of the FPC board may be located on the same plane as a surface of the third adhesive 03 away from the first surface E1 of the FPC board, so that the whole piece of adhesive formed by the first adhesive 01 and the third adhesive 03 may have a flat surface, which facilitates adherence of the driving circuit. When the foldable portion 3 is folded, both of an orthographic projection of the first adhesive 01 on the first main body portion 1 and an orthographic projection of the third adhesive 03 on the first main body portion 1 cover the entire of the second surface E2 of the first main body portion 1. An orthographic projection of the first adhesive 01 on the first main body portion 1 is complementary to an orthographic projection of the third adhesive 03 on the first main body portion 1.

In an embodiment, the first adhesive 01, the second adhesive 02, and the third adhesive 03 are double-sided taps.

In some embodiments, in order to achieve that a surface of the first adhesive 01 away from the first surface E1 of the FPC board and a surface of the third adhesive 03 away from the first surface E1 of the FPC board are located on the same plane, a thickness of the second adhesive 02 may be less than a thickness of the first adhesive 01, and a thickness of the third adhesive 03 may be less than a thickness of the first adhesive 01. Since the first main body portion 1 substantially has the same structure as the second main body portion 2, a thicknesses of the first main body portion 1 is substantially the same as a thicknesses of the second main body portion 2. When the FPC board is in a folded state, as shown in FIG. 6, in the non-overlapping region S1, the thickness of the FPC board is a sum of the thicknesses of the first main body portion 1 and the first adhesive 01. In the overlapping region S2, the thickness of the FPC board is a sum of the thicknesses of the first main body portion 1, the second main body portion 2, the second adhesive 02, and the third adhesive 03. Therefore, in order to make the first adhesive 01 and the third adhesive 03 be on the same plane, the sum of the thicknesses of the first main body portion 1 and the first adhesive 01 may be substantially the same as the sum of the thicknesses of the first main body portion 1, the second main body portion 2, the second adhesive 02, and the third adhesive 03. Since the first main body portion 1 has substantially the same thickness as the second main body portion 2, the thickness of the first adhesive 01 may be approximately equal to the sum of the thicknesses of the second main body portion 2, the second adhesive 02, and the third adhesive 03.

In some embodiments, the FPC board in the embodiments of the present disclosure may include various types of FPC boards, such as a single-layer board or a multi-layer board. That is, the FPC board may include only one copper foil layer for wiring, or alternatively may include multiple copper foil layers for wiring. Referring to FIG. 3 and FIG. 6, taking the FPC board being a double-layer board as an example, the FPC board may include a base layer 011, a first copper foil layer 021 and a second copper foil layer 022 located on two sides (i.e., on the first surface E1 and the second surface E2) of the base layer 011, a first bonding adhesive layer 031 and a first cover film layer 041 sequentially arranged along a direction from the base layer 011 to the first copper foil layer 021, and a second bonding adhesive layer 032 and a second cover film layer 042 sequentially arranged along a direction from the base layer 011 to the second copper foil layer 022. A drilling process can be performed in the first copper foil layer 021, the second copper foil layer 022 and the base layer 011, so that the first copper foil layer 021 is connected to the second copper foil layer 022 via the through-hole in the base layer 011, and in turn the wiring in the first copper foil layer 021 can be electrically coupled to the wiring in the second copper foil layer 022. That is, the FPC board may have two wiring layers, and in turn may have a bigger wiring area. Of course, the FPC board may have more copper foil layers, or alternatively the FPC board may also have only one copper foil layer. That is, the FPC board may only include the base layer 011, and the first copper foil layer 021, the first bonding adhesive layer 031 and the first cover film layer 041 sequentially disposed on the base layer 011. The specific layer structure of the FPC board may be designed according to the wiring area required, and is not limited thereto. The layer structure of the FPC board may include the first main body portion 1, the second main body portion 2, and the foldable portion 3. That is, the first main body portion 1, the second main body portion 2, and the foldable portion 3 each have the layer structure described above, and each of the layer structures of the first main body portion 1, the second main body portion 2, and the foldable portion 3 may be integrally formed as a single piece.

In some embodiments, the FPC board may be a copper board without adhesive or a copper board with adhesive. When the FPC board is the copper board without adhesive, as shown in FIG. 3 and FIG. 6, the base layer 011 is directly bonded to the first copper foil layer 021 or the second copper foil layer 022. When the FPC board is the copper board with adhesive, a bonding adhesive may be disposed between the base layer 011 and first copper foil layer 021, and/or a bonding adhesive may be disposed between the base layer 011 and second copper foil layer 022.

In some embodiments, the base layer 011 may include a plurality of materials, such as at least one of polyimide or polyester, and a thickness of the base layer 011 may range from 17 um to 70 um. The material and thickness may be specifically formed as required, which is not limited herein.

In some embodiments, the first bonding adhesive layer 031 and/or the second bonding adhesive layer 032 may include a plurality of materials, such as at least one of epoxy or acrylic, and a thickness of the first bonding adhesive layer 031 and/or the second bonding adhesive layer 032 may range from 20 um to 30 um, which is not limited herein.

In some embodiments, the first covering film layer 041 and/or the second covering film layer 042 may include various materials, such as polyimide with a thickness ranging from 12 um to 50 um or solder mask with a thickness ranging from 10 um to 20 um, which is not limited herein.

In some embodiments, the FPC board may further include a reinforcing plate (not shown in the drawings) in a region where the electronic device 11 is located on the first surface of the FPC board, so as to increase a supporting force of the region. The reinforcing plate may include various materials, such as at least one of polyimide, polyester, and glass-epoxy, which is not limited herein.

In some embodiments, referring to FIG. 3 and FIG. 6, the FPC board may further include a first electro-magnetic interference (EMI) protection layer 51 and a second electro-magnetic interference protection layer 52. The first electro-magnetic interference protection layer 51 and the second electro-magnetic interference protection layer 52 are configured to shield signals transmitted by the wires in the first copper foil layer 021 and the second copper foil layer 022, so as to prevent the wires from being subjected to electro-magnetic interference. The first electro-magnetic interference protection layer 51 may include a first portion 511 and a second portion 512 which are separated apart from each other. The first portion 511 of the first electro-magnetic interference protection layer 51 is disposed only on the first surface E1 of the first main body portion 1 of the FPC board. The second portion 512 of the first electro-magnetic interference protection layer 51 is disposed only on the first surface E1 of the second main body portion 2 of the FPC board. Since the third adhesive 03 is disposed on the first surface E1 of the second main body portion 2 of the FPC board, specifically, the first electro-magnetic interference protection layer 51 may be disposed between the first surface E1 of the second main body portion 2 of the FPC board and the third adhesive 03, no electro-magnetic interference protection layer is disposed on the foldable portion 3, so as to decrease the thickness of the foldable portion 3, so that the foldable portion 3 is easy to be bent. The second electro-magnetic interference protection layer 52 is only disposed in a region on the second surface E2 of the FPC board corresponding to the first main body portion 1, and the first adhesive 01 is disposed in the overlapping region S2 on the second surface E2 of the FPC board. Specifically, the second electro-magnetic interference protection layer 52 may be disposed between the second surface E2 of the FPC board corresponding to the first main body portion 1 and the first adhesive 01, and no electro-magnetic interference protection layer is the second surface E2 of the second body portion 2. When the FPC board is in the folded state, a region on the second surface E2 of the second main body portion 2 is attached to the second surface E2 in the overlapping region S2 of the first main body portion 1, so that the area of the FPC board is approximately equal to the area of region where the first main body portion 1 is located. Referring to FIG. 6, the first portion 511 of the first electro-magnetic interference protection layer 51 is formed in a region on the first surface E1 of the first main body portion 1, and the second electro-magnetic interference protection layer 52 is formed in a region on the second surface E2 corresponding to the first main body portion 1. The first portion 511 of the first electro-magnetic interference protection layer 51 is formed in a region on the first surface E1 of the first main body portion 1 corresponding to the non-overlapping region S1 and the overlapping region S2; the second portion 512 of the first electro-magnetic interference protection layer 51 is formed in a region on the first surface E1 of the second main body portion 2. The second electro-magnetic interference protection layer 52 is formed between a portion of the second surface E2 in the overlapping region S2 of the first main body portion 1 and the second surface E2 of the second main body portion 2, so that the first electro-magnetic interference protection layer 51 and the second electro-magnetic interference protection layer 52 can completely cover the two surfaces of the first main body portion 1 and the two surfaces of the second main body portion 2. The electro-magnetic interference protection layer (i.e., the second electro-magnetic interference protection layer 52) is only formed in the overlapping region S2 on the second surface E2 of the first main body portion 1, and no electro-magnetic interference protection layer is formed on the second surface E2 of the second main body portion 2, so that the overall thickness of the FPC board can be reduced.

In an embodiment, the first and second electro-magnetic interference protection layers 51 and 52 each include a conductive adhesive layer containing copper particles or silver particles. An orthogonal projection of the first portion 511 of the first electro-magnetic interference protection layer 51 on the first main body portion 1 overlaps orthogonal projections of both the first and second adhesives 01 and 02 on the first main body portion 1, and an orthogonal projection of the second portion 512 of the first electro-magnetic interference protection layer 51 on the second main body portion 2 overlaps an orthogonal projection of the third adhesive 03 on the second main body portion 2. An orthogonal projection of the second electro-magnetic interference protection layer 52 on the first main body portion 1 overlaps an orthogonal projection of both the first adhesive 01 and the second adhesive 02 on the first main body portion 1.

In some embodiments, the FPC board includes a bonding region 12 on either side of the first main body portion 1. A plurality of coupling pads are disposed in the bonding region 12, and the coupling pads in the bonding region 12 of the FPC board may be bonded to the coupling pads of an external device (e.g., a display panel) to connect the FPC board to the external device for transmission of electrical signals. The second main body portion 2 may be disposed opposite to the bonding region 12, and the lines extending from the coupling pads may extend from the coupling pads to the foldable portion 3 and then to the second main body portion 2. Under the condition of the multi-layer FPC board, the multiple copper foil layers may be provided with lines therein, and the lines in the multiple copper foil layers may be connected, so that the wiring area of the FPC board is effectively increased.

To sum up, the FPC board may be folded as described above, taking the FPC board being a double-layered board including a first copper foil layer 021 and a second copper foil layer 022 as an example, the areas of the first copper foil layer 021 and the second copper foil layer 022 may be increased, and in turn the area of the wiring region of the FPC board may satisfy the requirement; and moreover, the area occupied by FPC board can be decreased by folding the FPC board. Compared with the method for increasing the area of the wiring region of the FPC board by increasing the number of the copper foil layers, in the embodiment of the present disclosure, the folded FPC board has a decreased thickness, a reduced manufacture complexity and cost without sacrificing the area of the wiring region of the FPC board.

In some embodiments, in the embodiment in which the first electro-magnetic interference protection layer 51 and the second electro-magnetic interference protection layer 52 are formed, in the same way as described above, in order to realize that a surface of the first adhesive 01 away from the second surface E2 of the FPC board is located on the same plane as a surface of the third adhesive 03 away from the first surface E1 of the FPC board, when the FPC board is in the folded state, as shown in FIG. 6, in the non-overlapping region S1, the thickness of the FPC board includes the sum of the thicknesses of the base layer 011, the first copper foil layer 021, the first bonding adhesive layer 031, the first cover film layer 041, the second copper foil layer 022, the second bonding adhesive layer 032, the second cover film layer 042, the first portion 511 of the first electro-magnetic interference protection layer 51, the second electro-magnetic interference protection layer 52, and the first adhesive 01; in the overlapping region S2, the thickness of the FPC board includes twice the sum of the thicknesses of the base layer 011, the first copper foil layer 021, the first bonding adhesive layer 031, the first cover film layer 041, the second copper foil layer 022, the second bonding adhesive layer 032, and the second cover film layer 042, and further includes the sum of the thicknesses of the second portion 512 of the first electro-magnetic interference protection layer 51, the first portion 511 of the first electro-magnetic interference protection layer 51, the second electro-magnetic interference protection layer 52, the second adhesive 02, and the third adhesive 03. The thickness of the FPC board in the overlapping region S2 is substantially the same as the thickness of the FPC board in the non-overlapping region S1.

In some embodiments, in the FPC board according to the embodiments of the present disclosure, the thickness of the foldable portion 3 may be smaller than the thickness of the first main body portion 1 and smaller than the thickness of the second main body portion 2. That is, a thinning process may be performed on the foldable portion 3, so that the foldable portion 3 is easier to be bent. After the foldable portion 3 is bent, the tensile stress applied to each of the layers of the foldable portion 3 can be decreased, so that the layers of the foldable portion 3 are not easily deformed. Specifically, the thickness of the folded portion 3 can be decreased by removing the electro-magnetic interference protection layer (i.e., the first electro-magnetic interference protection layer 51 and the second electro-magnetic interference protection layer 52) on the folded portion 3 and by removing the adhesive (i.e., the first adhesive 01, the second adhesive 02, and the third adhesive 03) on the folded portion 3.

In some embodiments, in the FPC board in the embodiment of the present disclosure, the foldable portion 3 may further include at least one hollow-out portion 31 configured to release stress applied to the foldable portion 3 during bending, so as to avoid problems of dislocation, deformation, and the like for each of the layers of the foldable portion 3. The position and the number of the hollow-out portions 31 can be designed in various manners. For example, the foldable portion 3 may include a plurality of hollow-out portions 31, and the plurality of hollow-out portions 31 are arranged at equal intervals along a length direction of the foldable portion 3, so that the stress can be released more uniformly. In some embodiments, the hollow-out portion 31 may have various shapes. For example, the hollow-out portion 31 may have a rectangle or a circle shape, etc., and further, may have a rounded rectangle, which is not limited herein.

In some embodiments, the FPC board may further include a connector 4 connected to a side of the first main body portion 1. Specifically, the connector 4 may be connected between the bonding region 12 and the second main body portion 2. The connector 4 may be connected to an external circuit board. For example, when the FPC board is applied to a display panel, the connector 4 may be connected to a main board of the display panel.

In some embodiments, the FPC board may further include alignment marks disposed at corner on the first surface of the FPC board for alignment during preparation and installation of the FPC board.

As a second aspect, an embodiment of the present disclosure further provides a display panel including the FPC board described above.

Figure 7:
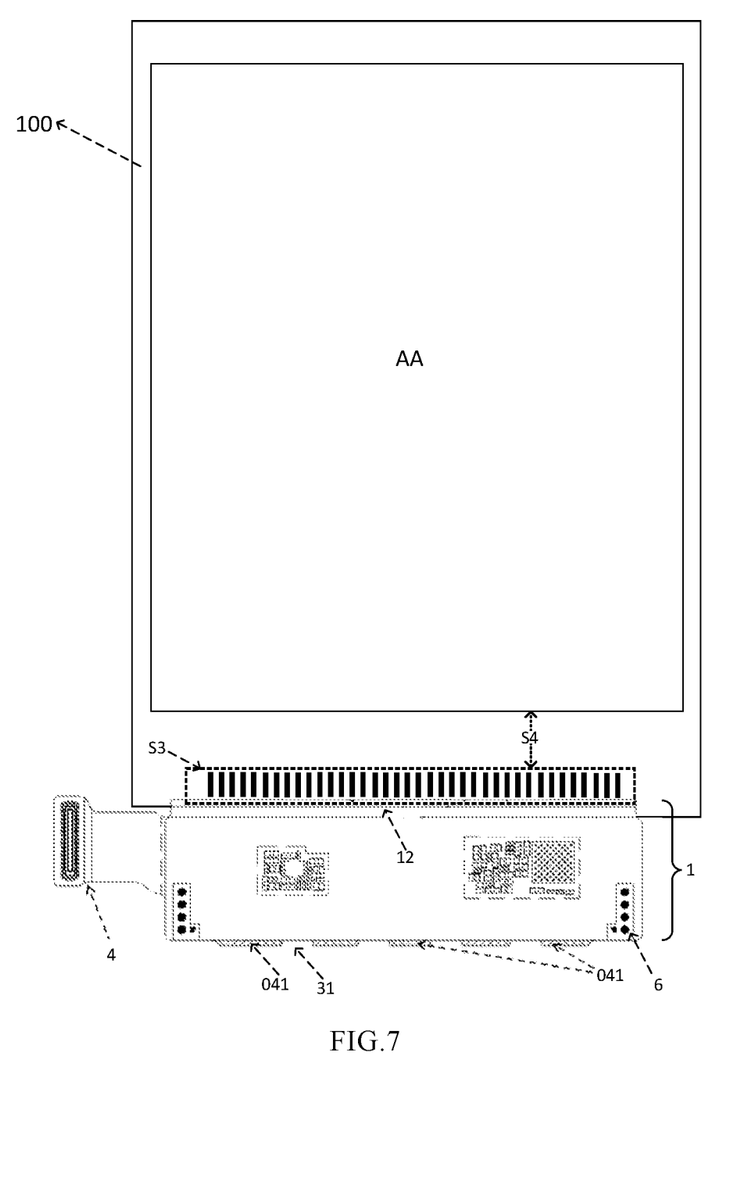
FIG. 7 is a schematic diagram showing a structure of a display panel according to an embodiment of the present disclosure.

Specifically, the FPC board may be applied to various types of display panels, such as a rigid display panel, a flexible display panel, or the like. Taking the display panel 100 in FIG. 7 as an example, the display panel may include a display region AA and a peripheral region around the display region AA. A plurality of pixel units arranged in an array, a plurality of gate lines extending in a row direction, and a plurality of data lines extending in a column direction are disposed in the display region AA. Each row of pixel units are connected to one gate line, and each column of pixel units are connected to one data line. The display panel 100 may further include a touch panel including a plurality of touch lines extending in a column direction. A bonding region S3 of the display panel is on a side (e.g., the lower side in the drawing) of the peripheral region. A plurality of coupling pads are disposed in the bonding region S3 of the display panel. The data lines and the touch lines extend along the column direction from the display region AA to the bonding region S3 of the display panel. Each of the data lines or each of the touch lines is connected to the coupling pad in the bonding region S3 of the display panel. The FPC board is on a side of the display panel 100 proximal to the bonding region S3 of the display panel, and the coupling pad in the bonding region 12 of the FPC board is bonded to the coupling pad in the bonding region S3 of the display panel in a one-to-one correspondence mode. Signals of the data lines or the touch lines are led out from the coupling pads in the bonding region 12 of the FPC board, and then led out from the lines of the copper foil layer. In the case that the display panel 100 is a flexible display panel, a foldable region S4 is between the bonding region S3 of the display panel and the display region AA of the display panel 100. After the FPC board is bonded to the display panel 100, the display panel 100 may be bent via the foldable region S4, so that the second surface E2 having the adhesive thereon of the FPC board (i.e., the whole surface adhesive formed by the first adhesive 01 and the third adhesive 03) is adhered to the backlight side of the display panel 100. That is, the FPC board is fold to the backside of the display panel 100 by bending the display panel 100 at the foldable region S4 and fixed to the backside of the display panel 100, thereby realizing the narrow bezel of the display panel 100, a small area occupied by the FPC board, and more space left on the back of the display panel 100 for disposing other components (e.g., a battery).

As a third aspect, a method for manufacturing a flexible circuit board is provided. The flexible circuit is located in a non-display region of a display panel and has a driving circuit thereon for driving the display panel. The method includes: providing a body portion including a first main body portion 1, a second main body portion 2 and a foldable portion 3, the foldable portion 3 being connected between the first main body portion 1 and the second main body portion 2, and bending the foldable portion 3 to fold the second main body portion 2 such that the second main body portion 2 overlaps the first main body portion 1.

It should be understood that the above implementations are merely exemplary embodiments for the purpose of illustrating the principles of the present disclosure, however, the present disclosure is not limited thereto. It will be apparent to those skilled in the art that various changes and modifications can be made without proximal to the spirit and spirit of the present disclosure, which are also to be regarded as the scope of the present disclosure.

What is claimed is:

1. A flexible circuit board in a non-display region of a display panel and provided with a driving circuit for driving the display panel thereon, the flexible circuit board comprising a first main body portion, a second main body portion, and a foldable portion, and the foldable portion being between the first main body portion and the second main body portion; wherein
the foldable portion is capable of being bended to fold the second main body portion such that the second main body portion overlaps the first main body portion,
the flexible circuit board comprises a first surface and a second surface opposing to each other, wherein
the first main body portion has an overlapping region and a non-overlapping region, a region where the second main body portion overlaps the first main body portion after the foldable portion is bent being the overlapping region, and a region where the second main body portion does not overlap the first main body portion after the foldable portion is bent being the non-overlapping region,
the flexible circuit board further comprises a first adhesive, a second adhesive, and a third adhesive,
the first adhesive is on the second surface, corresponds to the first main body portion, and in the non-overlapping region,
the second adhesive is on the second surface, corresponds to the first main body portion, and is in the overlapping region,
the third adhesive is on the first surface, corresponds to the second main body portion, and covers the second main body portion, and
none of the first adhesive, the second adhesive and the third adhesive is on two sides of the foldable portion.

2. The flexible circuit board of claim 1, wherein
an orthographic projection of the first adhesive on the first main body portion is completely within the non-overlapping region of the first main body portion, and
an orthographic projection of the second adhesive on the first main body portion is completely within the overlapping region of the first main body portion.

3. The flexible circuit board of claim 1, wherein
when the second main body portion overlaps the first main body portion after the foldable portion is bent, the second main body portion is attached to the first main body portion through the second adhesive in the overlapping region, and a surface of the first adhesive distal to the first surface is on the same plane as a surface of the third adhesive distal to the first surface.

4. The flexible circuit board of claim 1, wherein
when the foldable portion is bent, both an orthographic projection of the first adhesive on the first main body portion and an orthographic projection of the third adhesive on the first main body portion completely cover the second surface of the first main body portion, and the orthographic projection of the first adhesive on the first main body portion is complementary to the orthographic projection of the third adhesive on the first main body portion.

5. The flexible circuit board of claim 1, wherein
the driving circuit is capable of being attached to a non-light-emitting side of the display panel through the first and second adhesives.

6. The flexible circuit board of claim 1, wherein
each of a thickness of the second adhesive and a thickness of the third adhesive is less than a thickness of the first adhesive.

7. The flexible circuit board of claim 1, wherein
each of the first adhesive, the second adhesive and the third adhesive is a double-sided adhesive tape.

8. The flexible circuit board of claim 1, wherein
the first main body portion comprises a first covering film layer, a first bonding adhesive layer, a first copper foil layer, a base layer, a second copper foil layer, a second bonding adhesive layer and a second covering film layer sequentially arranged, and
each of the second main body portion and the foldable portion comprises the same structure as the first main body.

9. The flexible circuit board of claim 1, further comprising a first electro-magnetic interference protection layer and a second electro-magnetic interference protection layer both configured to shield electromagnetic interference; wherein
the first electro-magnetic interference protection layer comprises a first portion and a second portion separated apart from each other, the first portion is on the first surface and corresponds to the first main body portion, the second portion is on the first surface and corresponds to the second main body portion, and the third adhesive is on a side of the second portion of the first electro-magnetic interference protection layer away from the second surface,
the second electro-magnetic interference protection layer is on the second surface and corresponds to the first main body portion, and the first adhesive is on a side of the second electro-magnetic interference protection layer away from the first surface,
none of the first electro-magnetic interference protection layer and the second electro-magnetic interference protection layer is on the first surface and the second surface of the foldable portion, and
no electro-magnetic interference protection layer is on the second surface of the second main body portion.

10. The flexible circuit board of claim 9, wherein
each of the first electro-magnetic interference protection layer and the second electro-magnetic interference protection layer comprises a conductive adhesive layer containing copper particles or silver particles.

11. The flexible circuit board of claim 9, wherein
an orthographic projection of the first portion of the first electro-magnetic interference protection layer on the first main body portion overlaps both of orthographic projections of the first adhesive and the second adhesive on the first main body portion, and
an orthographic projection of the second portion of the first electro-magnetic interference protection layer on the second main body portion overlaps an orthographic projection of the third adhesive on the second main body portion,
an orthographic projection of the second electro-magnetic interference protection layer on the first main body portion overlaps the orthographic projections of the first adhesive and the second adhesive on the first main body portion.

12. The flexible circuit board of claim 1, further comprising a first bonding region on a side of the first main body portion away from the second main body portion, wherein
a coupling pad in the first bonding region is configured to be bonded with a coupling pad of the display panel.

13. The flexible circuit board of claim 1, wherein the foldable portion has at least one hollowed-out portion for relieving stress.

14. The flexible circuit board of claim 13, wherein the foldable portion has a plurality of hollowed-out portions uniformly distributed and spaced apart from each other along a length direction of the foldable portion.

15. The flexible circuit board of claim 1, wherein a thickness of the foldable portion is less than each of a thickness of the first main body portion and a thickness of the second main body portion.

16. A flexible display panel having a display region, a foldable region and a second bonding region, the foldable region being between the display region and the second bonding region, wherein
    the flexible display panel comprises the flexible circuit board of claim 1 having a first bonding region, a coupling pad in the first bonding region is capable of being bonded to a coupling pad in the second bonding region, and
    after the flexible display panel is bent at the foldable region, the driving circuit of the flexible circuit board is folded to the non-light-emitting side of the flexible display panel.

17. A flexible circuit board in a non-display region of a display panel with a driving circuit for driving the display panel provided thereon, the flexible circuit board comprising a first main body portion, a second main body portion, and a foldable portion; the foldable portion being between the first main body portion and the second main body portion; wherein
    the foldable portion is capable of being bent to fold the second main body portion such that the second main body portion overlaps the first main body portion,
    the flexible circuit board comprises a first surface and a second surface opposing to each other,
    the first main body portion has an overlapping region and a non-overlapping region, a region where the second main body portion overlaps the first main body portion after the foldable portion is bent being the overlapping region, and a region where the second main body portion does not overlap the first main body portion after the foldable portion is bent being the non-overlapping region,
    the flexible circuit board further comprises a first adhesive, a second adhesive, and a third adhesive,
    the first adhesive is on the second surface, corresponds to the first main body portion, and in the non-overlapping region,
    the second adhesive is on the second surface, corresponds to the first main body portion, and is in the overlapping region,
    the third adhesive is on the first surface, corresponds to the second main body portion, and covers the second main body portion, and
    none of the first adhesive, the second adhesive and the third adhesive is on two sides of the foldable portion,
    when the second main body portion overlaps the first main body portion after the foldable portion is bent, the second main body portion is attached to the first main body portion through the second adhesive in the overlapping region, and a surface of the first adhesive distal to the first surface is on the same plane as a surface of the third adhesive distal to the first surface,
    when the foldable portion is fold, an orthographic projection of the first adhesive on the first main body portion and an orthographic projection of the third adhesive on the first main body portion completely cover the second surface of the first main body portion, and the orthographic projection of the first adhesive on the first main body portion is complementary to the orthographic projection of the third adhesive on the first main body portion,
    the flexible circuit board further comprises a first electro-magnetic interference protection layer and a second electro-magnetic interference protection layer both configured to shield electromagnetic interference,
    the first electro-magnetic interference protection layer comprises a first portion and a second portion separated apart from each other,
    the first portion is on the first surface and corresponds to the first main body portion, the second portion is on the first surface and corresponds to the second main body portion, and the third adhesive is on a side of the second portion of the first electro-magnetic interference protection layer away from the second surface,
    the second electro-magnetic interference protection layer is on the second surface and corresponds to the first main body portion, and the first adhesive is on a side of the second electro-magnetic interference protection layer away from the first surface,
    none of the first electro-magnetic interference protection layer and the second electro-magnetic interference protection layer is on the first surface and the second surface of the foldable portion, and
    no electro-magnetic interference protection layer is on the second surface of the second main body portion.

18. A method for manufacturing a flexible circuit board, the flexible circuit board being in a non-display region of a display panel and provided with a driving circuit for driving the display panel thereon, wherein the method comprises:
    providing a body portion comprising a first main body portion, a second main body portion, and a foldable portion, the foldable portion being between the first main body portion and the second main body portion; and
    bending the foldable portion to fold the second main body portion such that the second main body portion overlaps the first main body portion,
    the flexible circuit board comprises a first surface and a second surface opposing to each other, wherein
    the first main body portion has an overlapping region and a non-overlapping region, a region where the second main body portion overlaps the first main body portion after the foldable portion is bent being the overlapping region, and a region where the second main body portion does not overlap the first main body portion after the foldable portion is bent being the non-overlapping region,
    the method further comprises forming a first adhesive, a second adhesive, and a third adhesive, such that:
    the first adhesive is on the second surface, corresponds to the first main body portion, and in the non-overlapping region,
    the second adhesive is on the second surface, corresponds to the first main body portion, and is in the overlapping region,
    the third adhesive is on the first surface, corresponds to the second main body portion, and covers the second main body portion, and
    none of the first adhesive, the second adhesive and the third adhesive is on two sides of the foldable portion.

* * * * *